United States Patent
Camacho et al.

(10) Patent No.: US 7,932,130 B2
(45) Date of Patent: Apr. 26, 2011

(54) METHOD FOR FORMING AN ETCHED RECESS PACKAGE ON PACKAGE SYSTEM

(75) Inventors: Zigmund Ramirez Camacho, Singapore (SG); Henry Descalzo Bathan, Singapore (SG); Lionel Chien Hui Tay, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/185,058

(22) Filed: Aug. 1, 2008

(65) Prior Publication Data

US 2010/0025830 A1 Feb. 4, 2010

(51) Int. Cl.
*H01L 21/50* (2006.01)
*H01L 21/48* (2006.01)
*H01L 21/44* (2006.01)

(52) U.S. Cl. ........ 438/109; 438/123; 438/172; 438/191; 438/235; 257/677; 257/E23.053; 257/E21.51

(58) Field of Classification Search .................. None
See application file for complete search history.

(56) References Cited

U.S. PATENT DOCUMENTS

| 5,830,800 | A  * | 11/1998 | Lin ................................ 438/459 |
| 6,306,682 | B1 * | 10/2001 | Huang et al. ................. 438/107 |
| 6,710,430 | B2 * | 3/2004  | Minamio et al. ............. 257/666 |
| 6,972,372 | B1 * | 12/2005 | Tsai et al. ..................... 174/551 |
| 6,974,776 | B2 * | 12/2005 | Dean et al. .................... 438/678 |
| 7,517,733 | B2 * | 4/2009  | Camacho et al. ............ 438/123 |
| 2006/0261453 | A1 * | 11/2006 | Lee et al. ..................... 257/676 |
| 2007/0181990 | A1 | 8/2007 | Huang et al. |
| 2007/0187826 | A1 | 8/2007 | Shim et al. |
| 2007/0209834 | A1 | 9/2007 | Kuan et al. |
| 2007/0210443 | A1 | 9/2007 | Merilo et al. |
| 2007/0252284 | A1 | 11/2007 | Su et al. |
| 2007/0284715 | A1 | 12/2007 | Li et al. |
| 2009/0072366 | A1 | 3/2009 | Badakere Govindaiah et al. |

\* cited by examiner

*Primary Examiner* — Zandra V. Smith
*Assistant Examiner* — Khanh B Duong
(74) *Attorney, Agent, or Firm* — Mikio Ishimaru

(57) ABSTRACT

An integrated circuit package system includes: providing a die attach paddle with interconnection pads connected to a bottom surface of the die attach paddle; connecting a first device to the interconnection pads with a bond wire; connecting a lead to the interconnection pad or to the first device; encapsulating the first device and the die attach paddle with an encapsulation having a top surface; and etching the die attach paddle leaving a recess in the top surface of the encapsulation.

8 Claims, 3 Drawing Sheets

METHOD FOR FORMING AN ETCHED RECESS PACKAGE ON PACKAGE SYSTEM

TECHNICAL FIELD

The present invention relates generally to integrated circuits and more particularly to a system for utilizing an etched recess in a package on package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses, and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing a die attach paddle with interconnection pads connected to a bottom surface of the die attach paddle; connecting a first device to the interconnection pads with a bond wire; connecting a lead to the interconnection pad or to the first device; encapsulating the first device and the die attach paddle with an encapsulation having a top surface; and etching the die attach paddle leaving a recess in the top surface of the encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
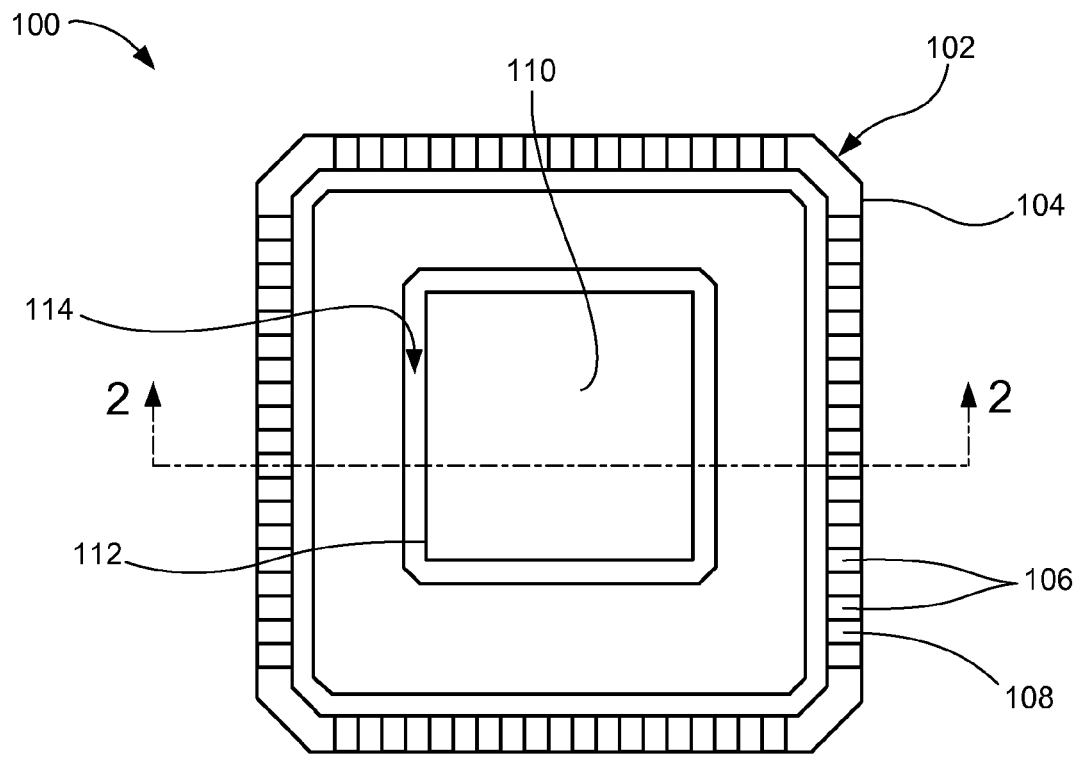
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having an encapsulation 102 such as an epoxy mould compound. The encapsulation 102 has an encapsulation edge 104.

At the edge 104 of the encapsulation 102 are leads 106. The leads 106 do not extend substantially beyond the edge 104 of the encapsulation 102. The encapsulation 102 fills spaces 108 in between the leads 106.

A second device 110 such as a wafer level chip scale package (WLCSP), a redistributed line (RDL) die, or an area array package is shown mounted above the encapsulation 102. Around an outer edge 112 of the second device 110 is a recess 114. The second device 110 is mounted inside the recess 114.

Figure 2:
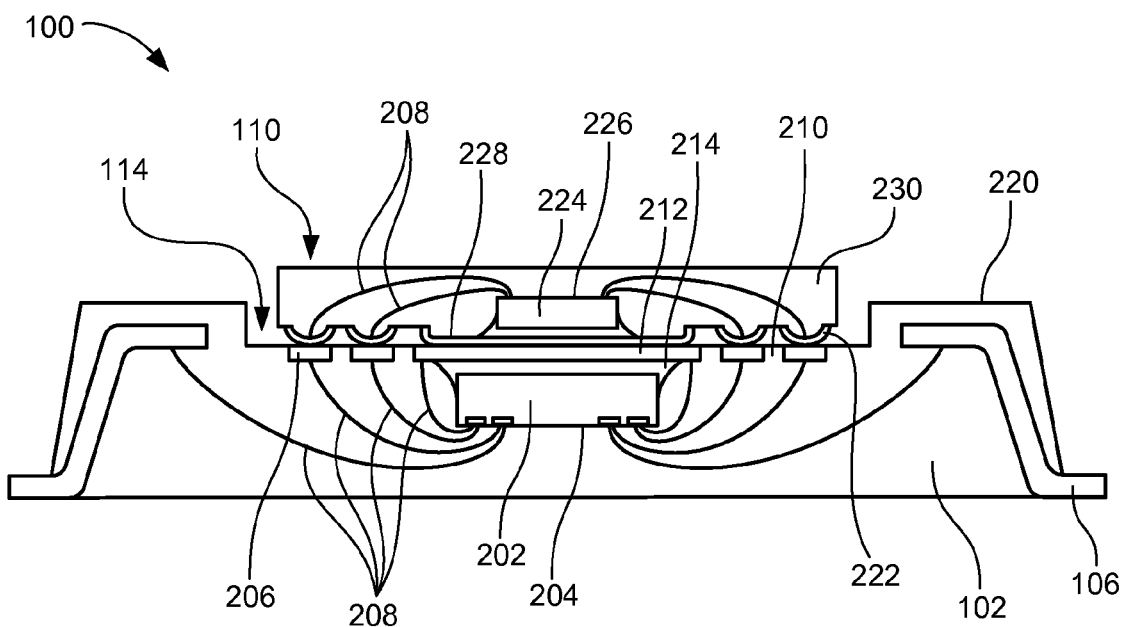
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having first device 202 such as a wire-bonded die. The first device 202 has an active side 204.

The active side 204 of the first device 202 is connected to at least one of the interconnection pads 206. The interconnection pads 206 are coated or composed substantially of NiPd—Au. This nickel palladium and gold composition resists copper etching and allows the formation of the recess 114.

It has been unexpectedly discovered that the use of the interconnection pads 206 enables an electrical connection of the first device 202 without added structural elements such as interposers and substrates. This allows for a very thin package by reducing the number of internal components.

The active side 204 of the first device 202 is connected to the interconnection pads 206 with bond wires 208. The encapsulation 102 encapsulates the bond wires 208. The encapsulation also adds structural support by filling spaces 210 in between the interconnection pads 206.

The first device 202 is attached to a die pad 212 with die attach adhesive 214. The die pad is coated or composed substantially of NiPd—Au. The die attach adhesive 214 should be a high thermally conductive adhesive to allow the first device 202 to shed heat through the die pad 212.

The encapsulation 102 forms a rigid structure around the interconnection pads 206, the bond wires 208, and the first device 202. It has been unexpectedly discovered that the use of the encapsulation 102 as a rigid structure containing and supporting the interconnection pads 206, the bond wires 208, and the first device 202, reduces the complexity and number of internal components. The result being higher end-line yields, reduced costs, and competitive reduction in package size.

The encapsulation 102 also partially contains and partially surrounds the leads 106. The leads 106 are coated or composed substantially of NiPd—Au. The leads 106 are encapsulated by a top surface 220 of the encapsulation 102.

The leads 106 are connected to the interconnection pads 206 with the bond wires 208. The bond wires 208 are fully encapsulated by the encapsulation 102. Mounted in the recess 114, external to the encapsulation 102, is the second device 110.

The recess 114 further contributes to the thin dimensions of the package. Because of the absence of structural components such as interposers or substrates, the second device 110 may be mounted closer to the first device 202.

It has been unexpectedly discovered that mounting the first device 202 closer to the second device 110 reduces parasitic inductance. The reduction in distance reduces the inductance generated in high-speed components that can reduce the performance of the package as a whole, thus increasing the operating parameters of the first device 202 and the second device 110.

The second device 110 is connected to the interconnection pads 206 with interconnects such as metal connection pads 222. The second device 110 is shown having a second wire-bonded die 224 with an active side 226.

The active side 226 is connected to the metal connection pads 222 with the bond wires 208. The wire-bonded die 224 is attached to a second die pad 228 with the die attach adhesive 214. Encapsulating the second wire-bonded die 224 is a second encapsulation 230.

Figure 3:
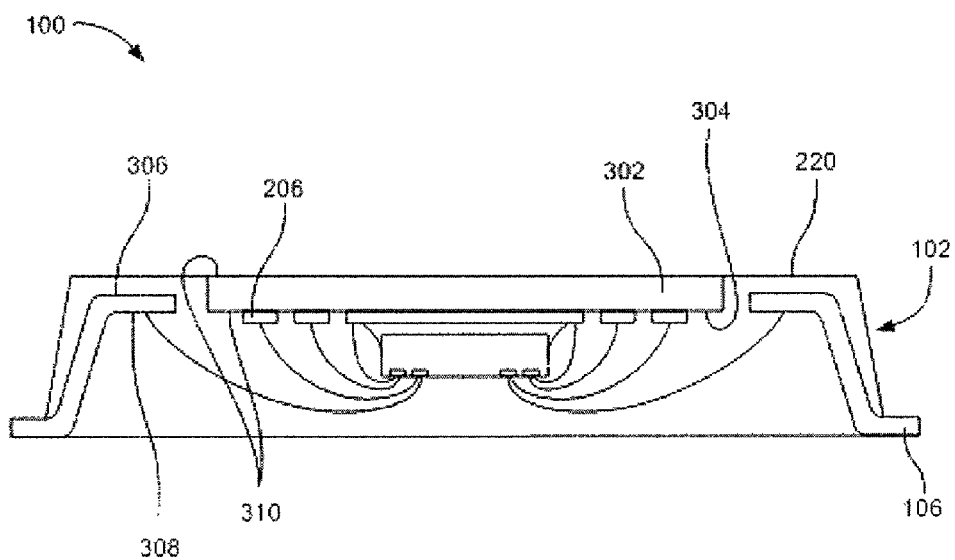
FIG. 3 a cross-sectional view of the integrated circuit package system of FIG. 2 in a pre-etch phase of manufacture.

Referring now to FIG. 3, therein is shown the cross-sectional view of the integrated circuit package system 100 of FIG. 2 in a pre-etch phase of manufacture. The integrated circuit package system 100 is shown having a die attach paddle 302 such as a copper die attach paddle.

The die attach paddle 302 has the interconnection pads 206 connected to a bottom surface 304 of the die attach paddle 302. The die attach paddle 302 is exposed on the top surface 220 of the encapsulation 102. The NiPd—Au is resistant to Copper etching, which will leave the leads 106 and the interconnection pads 206 remaining after a copper etch has etched the die attach paddle 302. This result may also be accomplished by a selective etching only the die attach paddle 302 in the recess 114. The leads 106 are shown thinner than the die attach paddle 302 and having a top planar surface 306 and a bottom planar surface 308. Both the top planar surface 306 and the bottom planar surface 308 terminate near the die attach paddle 302 and either the top planar surface 306 or the bottom planar surface 308 are coplanar with a planar surface 310 of the die attach paddle 302. The bottom planar surface 308 is above the level of the interconnection pads 206.

Figure 4:
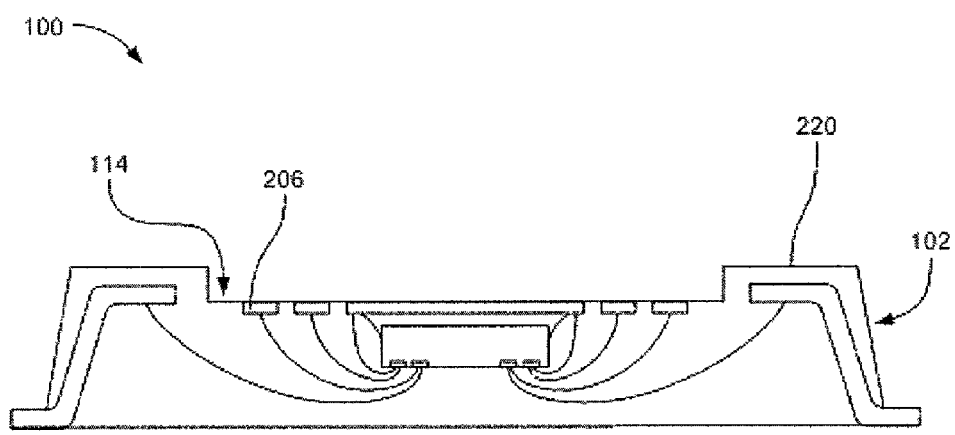
FIG. 4 is the integrated circuit package system of FIG. 2 in a post-etch phase of manufacture.

Referring now to FIG. 4, therein is shown the integrated circuit package system 100 of FIG. 2 in a post-etch phase of manufacture after the die attach paddle 302 of FIG. 3 has been removed. The integrated circuit package system 100 is shown having the recess 114 created near the top surface of the encapsulation 102.

The interconnection pads 206 are now exposed in the bottom of the recess 114. The encapsulation 102 between the spaces 210 of the interconnection pads 206 is also exposed.

Figure 5:
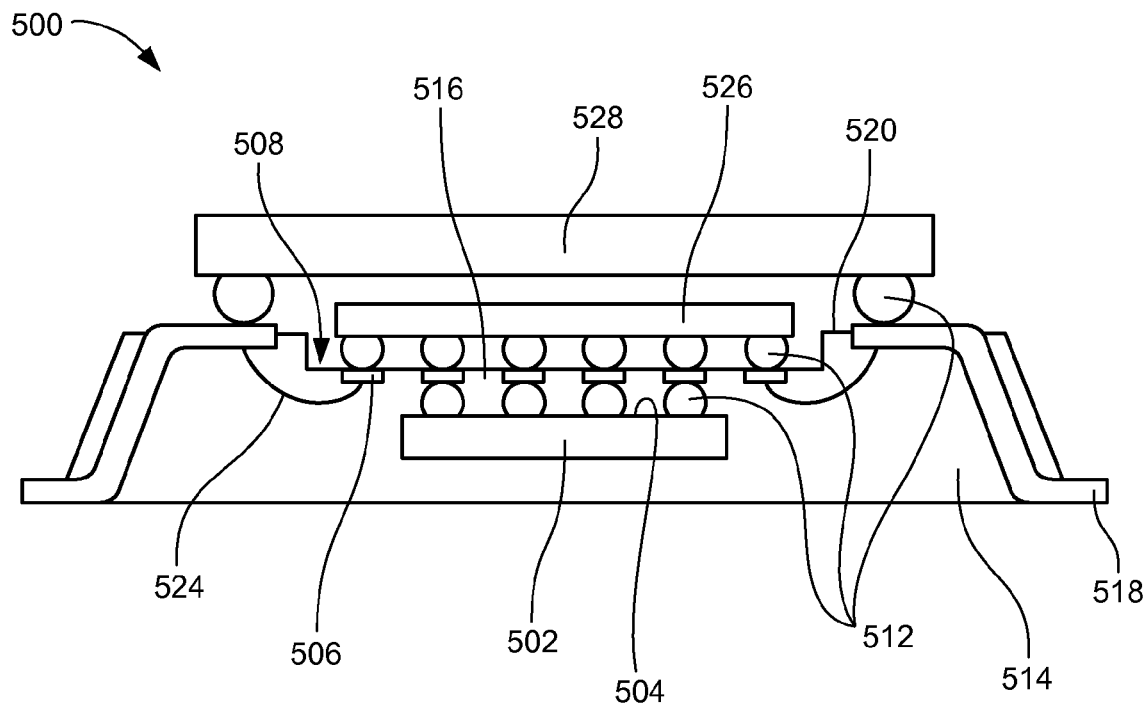
FIG. 5 is a cross-sectional view of an integrated circuit package system in a second embodiment of the present invention.

Referring now to FIG. 5, therein is shown a cross-sectional view of an integrated circuit package system 500 in a second embodiment of the present invention. The integrated circuit package system 500 is shown having first device 502 such as a flip chip. The first device 502 has an active side 504.

The active side 504 of the first device 502 is connected to interconnection pads 506. The interconnection pads 506 are coated or composed substantially of NiPd—Au. This nickel palladium and gold composition resists copper etching and allows the formation of a recess 508.

It has been unexpectedly discovered that the use of the interconnection pads 506 enables an electrical connection of the first device 502 without added structural elements such as interposers and substrates. This allows for a very thin package by reducing the number of internal components.

The active side 504 of the first device 502 is connected to the interconnection pads 506 with interconnects such as solder balls 512. An encapsulation 514, such as an epoxy mold compound, encapsulates the solder balls 512. The encapsulation also adds structural support by filling spaces 516 in between the interconnection pads 506.

The encapsulation 514 forms a rigid structure around the interconnection pads 506, the solder balls 512, and the first device 502. It has been unexpectedly discovered that the use of the encapsulation 514 as a rigid structure containing and supporting the interconnection pads 506, the solder balls 512, and the first device 502, reduces the complexity and number of internal components. The result being higher end-line yields, reduced costs, and competitive reduction in package size.

The encapsulation 514 also partially contains and partially surrounds leads such as leads 518. The leads 518 are coated or composed substantially of NiPd—Au. The leads 518 are exposed from a top surface 520 of the encapsulation 514.

The leads 518 are connected to the interconnection pads 506 with bond wires 524. The bond wires 524 are fully encapsulated by the encapsulation 514. Mounted in the recess 508, external to the encapsulation 514, is a second device 526 such as a wafer level chip scale package (WLCSP), a redistributed line (RDL) die, or an area array package.

The recess 508 further contributes to the thin dimensions of the package. Because of the absence of structural components such as interposers or substrates, the second device 526 may be mounted closer to the first device 502.

It has been unexpectedly discovered that mounting the first device 502 closer to the second device 526 reduces parasitic inductance. The reduction in distance reduces the inductance generated in high-speed components that can reduce the performance of the package as a whole, thus increasing the operating parameters of the first device 502 and the second device 526.

The second device 526 is connected to the interconnection pads 506 with the solder balls 512. Mounted above the second device 526 is a third device 528 such as a wafer level chip scale package (WLCSP), a redistributed line (RDL) die, or an area array package.

The third device 528 is connected to the leads 518 with the solder balls 512.

Figure 6:
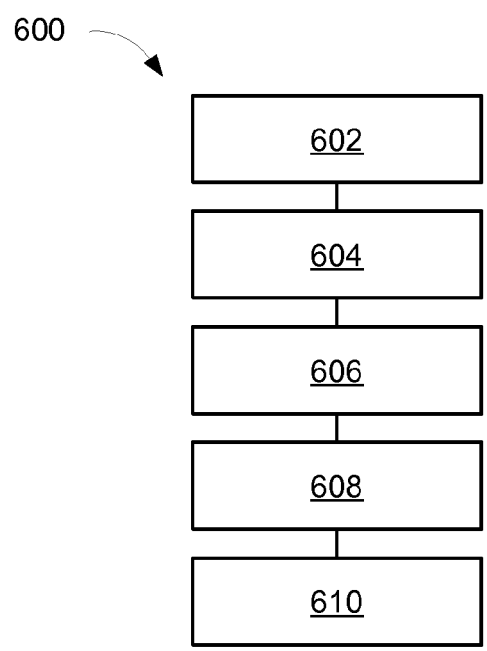
FIG. 6 is a flow chart of a system for manufacturing the integrated circuit package system of FIG. 1 in an embodiment of the present invention.

Referring now to FIG. 6, therein is shown a flow chart of a system 600 for manufacturing the integrated circuit package system 100 of FIG. 1 in an embodiment of the present invention. The system 600 includes providing a die attach paddle with interconnection pads connected to a bottom surface of the die attach paddle in a block 602; connecting a first device to the interconnection pads with a bond wire in a block 604; connecting a lead to the interconnection pad or to the first device in a block 606; encapsulating the first device and the die attach paddle with an encapsulation having a top surface in a block 608; and etching the die attach paddle leaving a recess in the top surface of the encapsulation in a block 610.

Thus, it has been discovered that the etched recess system of the present invention furnishes important and heretofore unknown and unavailable solutions, capabilities, and functional aspects for package on package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a die attach paddle with interconnection pads connected to a bottom surface of the die attach paddle;
   connecting a first device to the interconnection pads with a bond wire;
   connecting a lead to one of the interconnection pads or to the first device, the lead is thinner than the die attach paddle and has a top planar surface or a bottom planar surface coplanar with a planar surface of the die attach paddle, and the bottom planar surface is above the level of the interconnection pads;
   encapsulating the first device and the die attach paddle with an encapsulation having a top surface; and
   removing the die attach paddle leaving a recess in the top surface of the encapsulation with the interconnection pad exposed in the bottom of the recess.

2. The method as claimed in claim 1 further comprising:
   encapsulating the lead by the top surface of the encapsulation.

3. The method as claimed in claim 1 wherein:
   encapsulating the first device and the die attach paddle with the encapsulation having the top surface includes forming the encapsulation with the lead exposed at the top surface; and
further comprising:
   attaching a third device to the leads lead exposed from the top surface of the encapsulation.

4. The method as claimed in claim 1 wherein:
   connecting the first device includes connecting a wire-bonded die or connecting a flip chip.

5. A method for manufacturing an integrated circuit package system comprising:
   providing a die attach paddle with interconnection pads connected to a bottom surface of the die attach paddle;
   connecting a first device to the interconnection pads with a bond wire;
   connecting a second device to the interconnection pads with an interconnect;
   connecting a lead to one of the interconnection pads or to the first device, the lead is thinner than the die attach paddle and has a top planar surface or a bottom planar surface coplanar with a planar surface of the die attach paddle, and the bottom planar surface is above the level of the interconnection pads;

encapsulating the first device and the die attach paddle with an encapsulation having a top surface; and removing the die attach paddle leaving a recess in the top surface of the encapsulation with the interconnection pad exposed in the bottom of the recess.

6. The method as claimed in claim 5 wherein:

connecting the second device with the interconnect includes connecting the second device with metal connection pads or with solder balls.

7. The method as claimed in claim 5 wherein:

providing the die attach paddle with the interconnection pads includes providing interconnection pads that are coated or composed substantially of nickel, palladium, and gold.

8. The method as claimed in claim 5 wherein:

connecting the second device includes mounting the second device inside the recess on the top surface of the encapsulation.

* * * * *

UNITED STATES PATENT AND TRADEMARK OFFICE
CERTIFICATE OF CORRECTION

| | | |
|---|---|---|
| PATENT NO. | : 7,932,130 B2 | Page 1 of 1 |
| APPLICATION NO. | : 12/185058 | |
| DATED | : April 26, 2011 | |
| INVENTOR(S) | : Camacho et al. | |

It is certified that error appears in the above-identified patent and that said Letters Patent is hereby corrected as shown below:

Column 6:

claim 3, line 47, delete "leads lead" and insert therefor --lead--

Signed and Sealed this
Fourteenth Day of June, 2011

David J. Kappos
*Director of the United States Patent and Trademark Office*